United States Patent
Yang

(10) Patent No.: US 9,082,486 B2
(45) Date of Patent: Jul. 14, 2015

(54) ROW DECODING CIRCUIT AND MEMORY

(71) Applicant: Grace Semiconductor Manufacturing Corporation, Shanghai (CN)

(72) Inventor: Guangjun Yang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 122 days.

(21) Appl. No.: 14/041,887

(22) Filed: Sep. 30, 2013

(65) Prior Publication Data

US 2014/0177333 A1 Jun. 26, 2014

(30) Foreign Application Priority Data

Dec. 21, 2012 (CN) .......................... 2012 1 0564385

(51) Int. Cl.
*G11C 7/00* (2006.01)
*G11C 16/08* (2006.01)
*G11C 8/08* (2006.01)
*G11C 16/04* (2006.01)

(52) U.S. Cl.
CPC ...... *G11C 16/08* (2013.01); *G11C 8/08* (2013.01); *G11C 16/0433* (2013.01)

(58) Field of Classification Search
CPC ............ G11C 16/08; G11C 8/08; G11C 8/10; G11C 16/0433

USPC ................. 365/185.2, 185.23, 189.11, 210.1, 365/230.06

See application file for complete search history.

(56) References Cited

U.S. PATENT DOCUMENTS 6,804,153 B2 * 10/2004 Yoshizawa et al. ...... 365/189.15
2010/0002493 A1 * 1/2010 Miyakawa et al. ........... 365/149

FOREIGN PATENT DOCUMENTS

CN  102298967 A  12/2011

* cited by examiner

*Primary Examiner* — Tan T. Nguyen
(74) *Attorney, Agent, or Firm* — Harness, Dickey & Pierce, P.L.C.

(57) ABSTRACT

A row decoding circuit and a memory are provided. The row decoding circuit is adapted for providing a word line operation voltage and a control-gate line operation voltage to a dual-bit split gate flash memory array, and includes a dummy row decoding unit, at least one row decoding unit and a driving voltage generating circuit. The dummy row decoding unit includes a first dummy control-gate line voltage output, a second dummy control-gate line voltage output and at least one dummy word line voltage output. The row decoding unit includes a first control-gate line voltage output, a second control-gate line voltage output and at least one word line voltage output. The driving voltage generating circuit is adapted for providing a third driving voltage to the first control-gate line voltage output and the second control-gate line voltage output.

20 Claims, 5 Drawing Sheets

ROW DECODING CIRCUIT AND MEMORY

CROSS-REFERENCE TO RELATED APPLICATIONS

The present application claims priority to Chinese patent application No. 201210564385.5, filed on Dec. 21, 2012, and entitled "ROW DECODING CIRCUIT AND MEMORY", the entire disclosure of which is incorporated herein by reference.

TECHNICAL FIELD

The present disclosure generally relates to memory technology, and more particularly, to a row decoding circuit and a memory.

BACKGROUND

As an integrated circuit memory device, a flash memory has a function of storing information which is electrically erasable. Therefore, flash memory is widely used in electronic products, such as laptops, mobile phones, digital music players and etc. According to different gate structures, flash memories are generally classified into two types: stacked-gate flash memories and split-gate flash memories, in which memory units are required to be arranged in an array for proper operation and each memory unit is used to store a single bit of data. In such a memory array, a field oxide layer or a trench insulator layer is used to separate memory units. Meanwhile, in order to improve the programming efficiency of the flash memory, memory units are designed to occupy a large area, so as to obtain a high capacitance coupling ratio. However, the memory units of flash memory having a relatively large area may reduce the storage density.

In order to improve the storage density of flash memory, a dual-bit split gate flash memory is provided. FIG. 1 illustrates a schematic structure diagram of a conventional dual-bit split gate flash memory array and a row decoding circuit thereof. Referring to FIG. 1, the dual-bit split gate flash memory array includes a plurality of memory units (e.g., the memory unit M) arranged in an array, a plurality of bit lines ($BL_1$, $BL_2$, $BL_3$, ..., $BL_n$), a plurality of word lines ($WL_1$, $WL_2$, ..., $WL_m$) and a plurality of control-gate lines ($CG_1$ and $CG_2$, $CG_3$ and $CG_4$, ..., $CG_{2m-1}$ and $CG_{2m}$). The plurality of bit lines, the plurality of word lines and the plurality of control-gate lines are used to select a memory unit and to provide a drive signal. The memory unit has a dual-bit split gate flash transistor structure. Each memory unit includes two memory bits: a first memory bit and a second memory bit, and a middle electrode shared by the two memory bits. Each memory bit includes a bit line electrode and a control-gate electrode. Each memory unit is connected to two adjacent bit lines. Namely, the bit line electrode of the first memory bit and the bit line electrode of the second memory bit are connected to the two adjacent bit lines, respectively. For example, the memory unit M includes a first memory bit $C_1$ and a second memory bit $C_2$. A middle electrode shared by the first memory bit $C_1$ and the second memory bit $C_2$ is connected to the word line $WL_1$. The bit line electrode of the first memory bit $C_1$ is connected to the bit line $BL_3$, and the control-gate electrode of the first memory bit $C_1$ is connected to control-gate line $CG_1$. The bit line electrode of the second memory bit $C_2$ is connected to the bit line $BL_2$, and the control-gate electrode of the second memory bit is connected to the control-gate line $CG_2$.

When a reading or writing operation is performed on the dual-bit split gate flash memory shown in FIG. 1, the row decoding circuit provides a word line operation voltage and a control-gate operation voltage to a selected memory unit. In the prior art, memory units in a same row corresponds to a same row decoding unit. For example, the dual-bit split gate flash memory array shown in FIG. 1 has m rows memory units corresponding to m row decoding units, i.e., the row decoding unit 1, the row decoding unit 2, ..., and the row decoding unit m. Each row decoding unit has a same structure. Referring to FIG. 2, a circuit schematic diagram of the row decoding unit 1 shown in FIG. 1 is provided in detail as an example.

The row decoding unit 1 shown in FIG. 2 includes: a pre-decoding unit 20 adapted for receiving an address signal, forming a selection signal based on the address signal, and providing the selection signal to a first level shift unit 211 and a control-gate line selection unit 23, where the selection signal is used to select a word line and a control-gate line of a memory unit which needs to be operated; the first level shift unit 211 adapted for receiving the selection signal, and outputting a first driving voltage $VDDH_1$ or a second driving voltage $VDDL_1$ based on the selection signal; a word line driving unit 221 including a PMOS transistor $P_1$ and a NMOS transistor $N_1$, adapted for receiving the first driving voltage $VDDH_1$ or the second driving voltage $VDDL_1$ output by the first level shift unit 211, and outputting a word line operation voltage to a word line $WL_1$; the control-gate line selection unit 23 adapted for receiving the selection signal, selecting one of the control-gate lines connected to two memory bits of a same memory unit based on the selection signal, and outputting a first control signal and a second control signal to a second level shift unit 212 and a third level shift unit 213, respectively; the second level shift unit 212 adapted for receiving the first control signal, and outputting a third driving voltage $VDDH_2$ or a fourth driving voltage $VDDL_2$ based on the first control signal; a first control-gate line driving unit 222 including a PMOS transistor $P_2$ and a NMOS transistor $N_2$, adapted for receiving the third driving voltage $VDDH_2$ or the fourth driving voltage $VDDL_2$ output by the second level shift unit 212, and outputting a first control-gate line operation voltage to a first control-gate line $CG_1$; the third level shift unit 213 adapted for receiving the second control signal, and outputting a third driving voltage $VDDH_2$ or a fourth driving voltage $VDDL_2$ based on the second control signal; and a second control-gate line driving unit 223 including a PMOS transistor $P_3$ and a NMOS transistor $N_3$, adapted for receiving the third driving voltage $VDDH_2$ or the fourth driving voltage $VDDL_2$ output by the third level shift unit 213, and outputting a second control-gate line operation voltage to the second control-gate line $CG_2$.

However, referring to the dual-bit split gate flash memory array shown in FIG. 1, each row of memory units corresponds to a row decoding unit, which increases the area of the row decoding circuit. In addition, in order to reduce the area of the row decoding circuit, the areas of driving transistors (the PMOS transistor $P_2$ and the NMOS transistor $N_2$) of the first control-gate line driving unit 222 and driving transistors (the PMOS transistor $P_3$ and the NMOS transistor $N_3$) of the second control-gate line driving unit 223 in the row decoding unit 1, need to be reduced, whereby the driving speed of the memory array will inevitably be decreased. Therefore, a row decoding unit with a high speed and a low circuit area is needed.

More information about the conventional dual-bit split gate flash memory is disclosed in a Chinese patent application No. 201010217954, entitled "row decoding circuit for dual-bit split gate flash memory and method for operating the same".

SUMMARY

The present disclosure aims to solve the problems of a low driving speed of the row decoding circuit, and a large circuit area in the conventional dual-bit split gate flash memory.

In order to solve the problems mentioned above, a row decoding circuit is provided in the present disclosure. The row decoding circuit is adapted for providing a word line operation voltage and a control-gate line operation voltage to a dual-bit split gate flash memory array, and includes a dummy row decoding unit, at least one row decoding unit and a driving voltage generating circuit, wherein the dummy row decoding unit includes a first dummy control-gate line voltage output, a second dummy control-gate line voltage output and at least one dummy word line voltage output, the first dummy control-gate line voltage output is connected to a control gate line which is connected to a first memory bit of each memory unit of a dummy memory array, the second dummy control-gate line voltage output is connected to a control gate line which is connected to a second memory bit of each memory unit of the dummy memory array, the at least one dummy word line voltage output is connected to a word line which is connected to each row of memory units of the dummy memory array, wherein the dummy memory array includes at least one row of memory units of the dual-bit split gate flash memory array; wherein the row decoding unit includes a first control-gate line voltage output, a second control-gate line voltage output and at least one word line voltage output, the first control-gate line voltage output is connect to a control-gate line which is connected to a first memory bit of each memory unit of a corresponding memory block, the second control-gate line voltage output is connected to a control-gate line which is connected to a second memory bit of each memory unit of the corresponding memory block, the at least one word line voltage output is connected to each row of memory units of the corresponding memory block, wherein the memory block includes at least one row of memory units of the dual-bit split gate flash memory array; wherein the driving voltage generating circuit is adapted for providing a third driving voltage to the first control-gate line voltage output and the second control-gate line voltage output, the driving voltage generating circuit includes a first voltage division unit, a second voltage division unit, a first comparison unit, and a second comparison unit, a control unit and a selection unit; wherein the first voltage division unit is adapted for dividing a voltage of the first dummy control-gate line voltage output to obtain a first divided voltage, the second voltage division unit is adapted for dividing a voltage of the second dummy control-gate line voltage output to obtain a second divided voltage; wherein the first comparison unit is adapted for comparing the first divided voltage and a reference voltage, and outputting a first comparison result, the second comparison unit is adapted for comparing the second divided voltage and the reference voltage, and outputting a second comparison result; wherein the control unit is adapted for outputting a control signal based on the first comparison result and the second comparison result which are input to the control unit, and the selection unit is adapted for selecting a first voltage or a second voltage as the third driving voltage under control of the control signal, wherein the first voltage is higher than the second voltage and the second voltage is higher than the reference voltage.

In some embodiments, the row decoding unit further includes a control-gate line decoding unit and at least one word line decoding unit.

In some embodiments, the first voltage division unit includes a plurality of PMOS transistors which are connected in series, gate and drain terminals of each PMOS transistor are connected, and a substrate and a source terminal of each PMOS transistor are connected.

In some embodiments, the second voltage division unit includes a plurality of PMOS transistors which are connected in series, gate and drain terminals of each PMOS transistor are connected, and a substrate and a source terminal of each PMOS transistor are connected.

In some embodiments, the first comparison unit includes a first comparator, a positive terminal of the first comparator unit is adapted for inputting the first divided voltage, a negative terminal of the first comparator unit is adapted for inputting the reference voltage, and an enable terminal of the first comparator unit is adapted for inputting a first enable signal.

In some embodiments, the second comparison unit includes a second comparator, a positive terminal of the second comparator unit is adapted for inputting the second divided voltage, a negative terminal of the second comparator unit is adapted for inputting the reference voltage, and an enable terminal of the second comparator unit is adapted for inputting a second enable signal.

In some embodiments, the control unit is an OR gate.

In some embodiments, if the selection signal is at a low level, the selection unit selects the first voltage as the third driving voltage to output; if the selection signal is at a high level, the selection unit selects the second voltage as the third driving voltage to output.

In some embodiments, the selection unit is a voltage selector.

In some embodiments, the first voltage is provided by a charge pump circuit.

In some embodiments, the second voltage is provided by a charge pump circuit.

In some embodiments, the reference voltage is ⅓ times of the second voltage.

In order to solve the problems mentioned above, a memory is provided in the present disclosure. The memory includes a dual-bit split gate flash memory array and a row decoding circuit mentioned above.

Compared with the prior art, the present disclosure has the following advantages:

By detecting the voltage of the first dummy control-gate line voltage output and the voltage of the second dummy control-gate line voltage output of the dummy row decoding unit, the third driving voltage, which is used to drive the first control-gate line voltage output and the second control-gate line voltage output of the row decoding unit, is controlled. Thus, in an initial stage, the first voltage is used to drive the first control-gate line voltage output and the second control-gate line voltage output. After voltage of any one of the first dummy control-gate line voltage output and the second dummy control-gate line voltage output is detected to rise to a predetermined voltage, the second voltage is used to drive the first control-gate line voltage output and the second control-gate line voltage output. The first voltage is greater than the second voltage. The driving speed of the memory array is enhanced by using the first voltage to drive the first control-gate line voltage output and the second control-gate line voltage output. Due to the enhancement of the driving voltage, the area of the driving transistor in the control-gate line driving unit of the row decoding unit is reduced.

On the other hand, a memory block including a plurality of rows of memory units corresponds to a row decoding unit. The first control-gate line voltage output provides an operation voltage to control-gate lines connected to first memory bits of memory units of the memory block. The second control-gate line voltage output provides an operation voltage to control-gate lines connected to second memory bits of each memory unit. That is, control-gate lines of different rows of memory units are connected to share a same drive voltage, whereby the circuit area is further reduced.

DETAILED DESCRIPTION

As described in the background, the row decoding circuit of a conventional dual-bit split gate flash memory array includes a plurality of row decoding units. Each row decoding unit corresponds to a row of memory units, and provides a word line operation voltage and a control-gate line operation voltage to the memory units. The conventional row decoding circuit occupies a large chip area. In addition, the area of driving transistors in each row decoding unit is reduced in order to reduce the area of the row decoding circuit, which may slow down the driving speed of the memory array. Therefore, a row decoding circuit with a high speed and a small area is provided in this disclosure based on the inventors' research.

In order to clarify the objects, characteristics and advantages of the disclosure, the embodiments of the present disclosure will be described in detail in conjunction with the accompanying drawings.

The disclosure will be described with reference to certain embodiments. It will be understood by those skilled in the art that various changes may be made without departing from the spirit or scope of the disclosure. Accordingly, the present disclosure is not limited to the embodiments disclosed.

Figure 3:
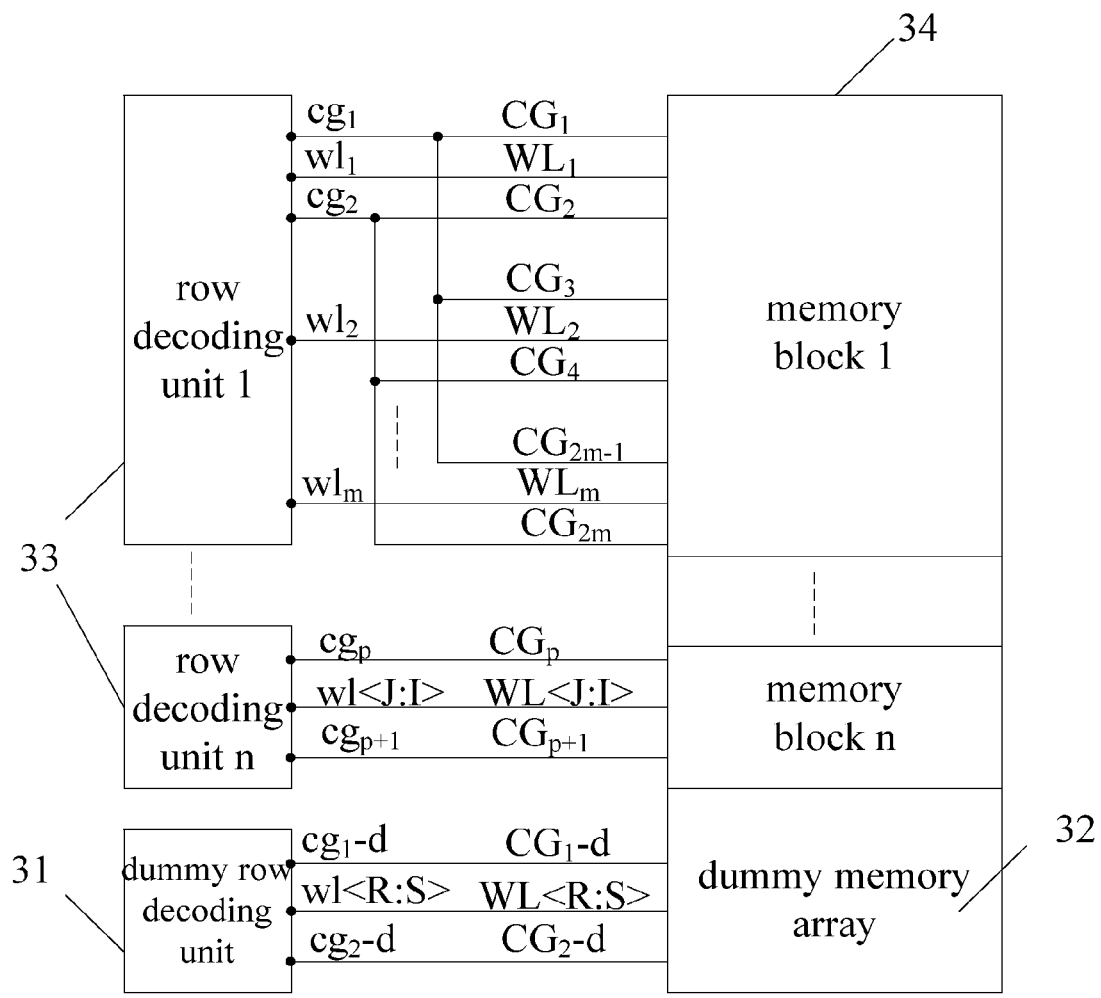
FIG. 3 illustrates a schematic structural diagram of a dummy row decoding unit and row decoding units of a row decoding circuit, and a dual-bit split gate flash memory array according to one embodiment of the present disclosure.

FIG. 3 illustrates a schematic structural diagram of a dummy row decoding unit and row decoding units of a row decoding circuit, and a dual-bit split gate flash memory array according to one embodiment of the present disclosure. The row decoding circuit is adapted to provide a word line operation voltage and a control-gate line operation voltage to the dual-bit split gate flash memory array. Referring to FIG. 3, the dual-bit split gate flash memory array 34 is divided into memory block 1 . . . , memory block n and dummy memory array 32 according to the connections between word lines and memory units. Each memory block includes memory units connected to at least one word line. The dummy memory array 32 includes memory units connected to at least one word line. In particular, referring to FIG. 3, the memory block 1 includes memory units connected to m word lines ($WL_1$, $WL_2$, ..., $WL_m$); the memory block n includes memory units connected to (I-J+1) word lines (WL<J:I>); the dummy memory array 32 includes memory units connected to (S-R+1) word lines (WL<R:S>). It should be noted that, the number of the word lines connected to the memory blocks and the dummy memory array 32 can be determined according to actual application requirements. In general, each of the memory block and the dummy memory array 32 include memory units connected to four word lines.

Corresponding to the structure of the dual-bit split gate flash memory array 34, the row decoding circuit includes a dummy row decoding unit 31 and a plurality of row decoding units 33 (a row decoding unit 1, . . . , a row decoding unit n).

Taking the row decoding unit 1 as an example, the structure of the row decoding circuit is described in detail. The row decoding unit 1 corresponds to the memory block 1 of the dual-bit split gate flash memory array 34, and provides a word line operation voltage and a control-gate line operation voltage to the memory block 1. Referring to FIG. 3, the row decoding unit 1 includes a first control-gate line voltage output $cg_1$, a second control-gate line voltage output $cg_2$ and m word line voltage outputs ($wl_1$, $wl_2$, . . . , $wl_m$). The first control-gate line voltage output $cg_1$ is connected to control-gate lines ($CG_1$, $CG_3$, . . . , $CG_{2m-1}$) which are connected to first memory bits of memory units of the memory block 1 respectively. The second control-gate line voltage output $cg_2$ is connected to control-gate lines ($CG_2$, $CG_4$, . . . , $CG_{2m}$) which are connected to second memory bits of memory units of the memory block 1 respectively. The m word line voltage outputs ($wl_1$, $wl_2$, . . . , $wl_m$) are connected to the word lines ($WL_1$, $WL_2$, . . . , $WL_m$) which are connected to rows of memory units of the memory block 1, respectively.

Figure 1:
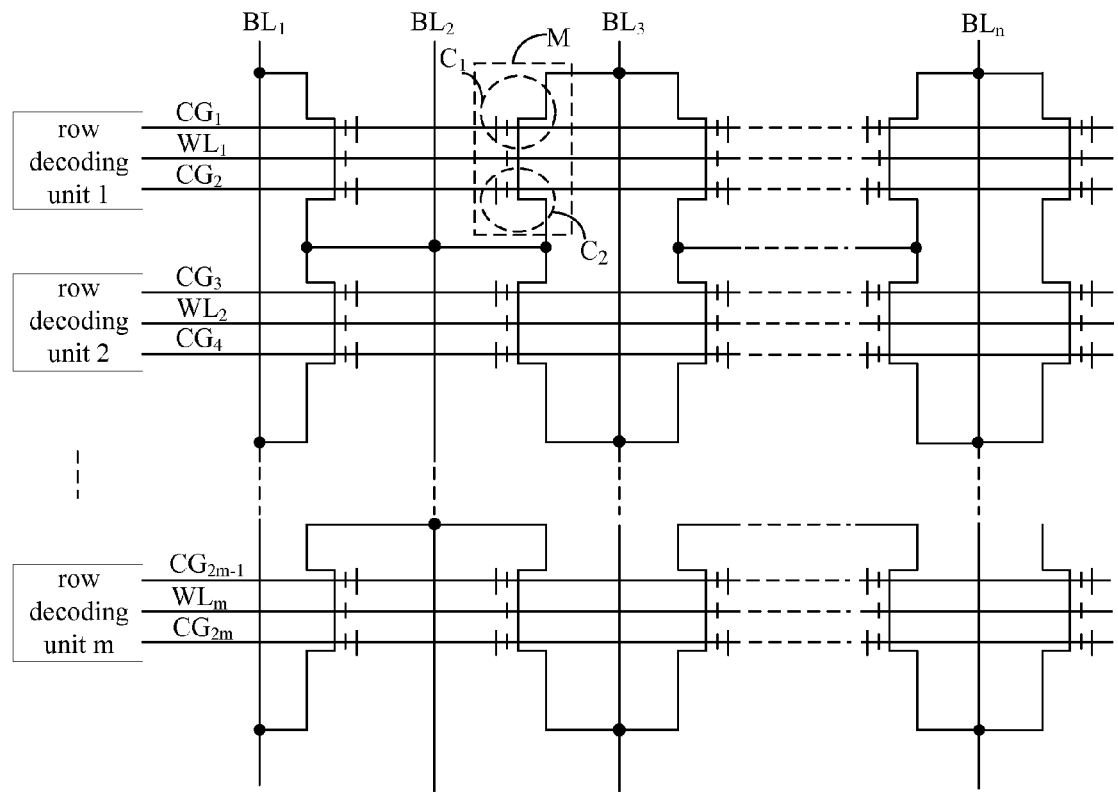
FIG. 1 illustrates a schematic structural diagram of a conventional dual-bit split gate flash memory array and a row decoding circuit thereof.
Figure 2:
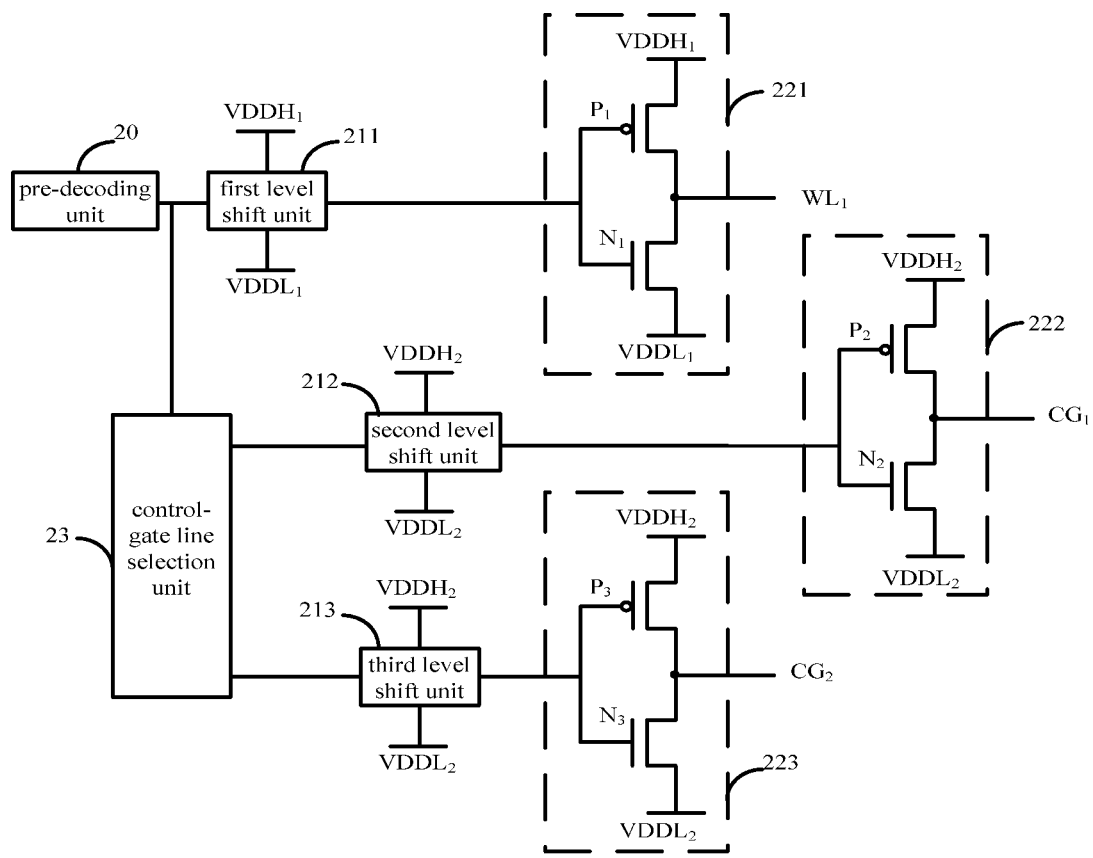
FIG. 2 illustrates a circuit schematic diagram of a row decoding unit 1 shown in FIG. 1.
Figure 4:
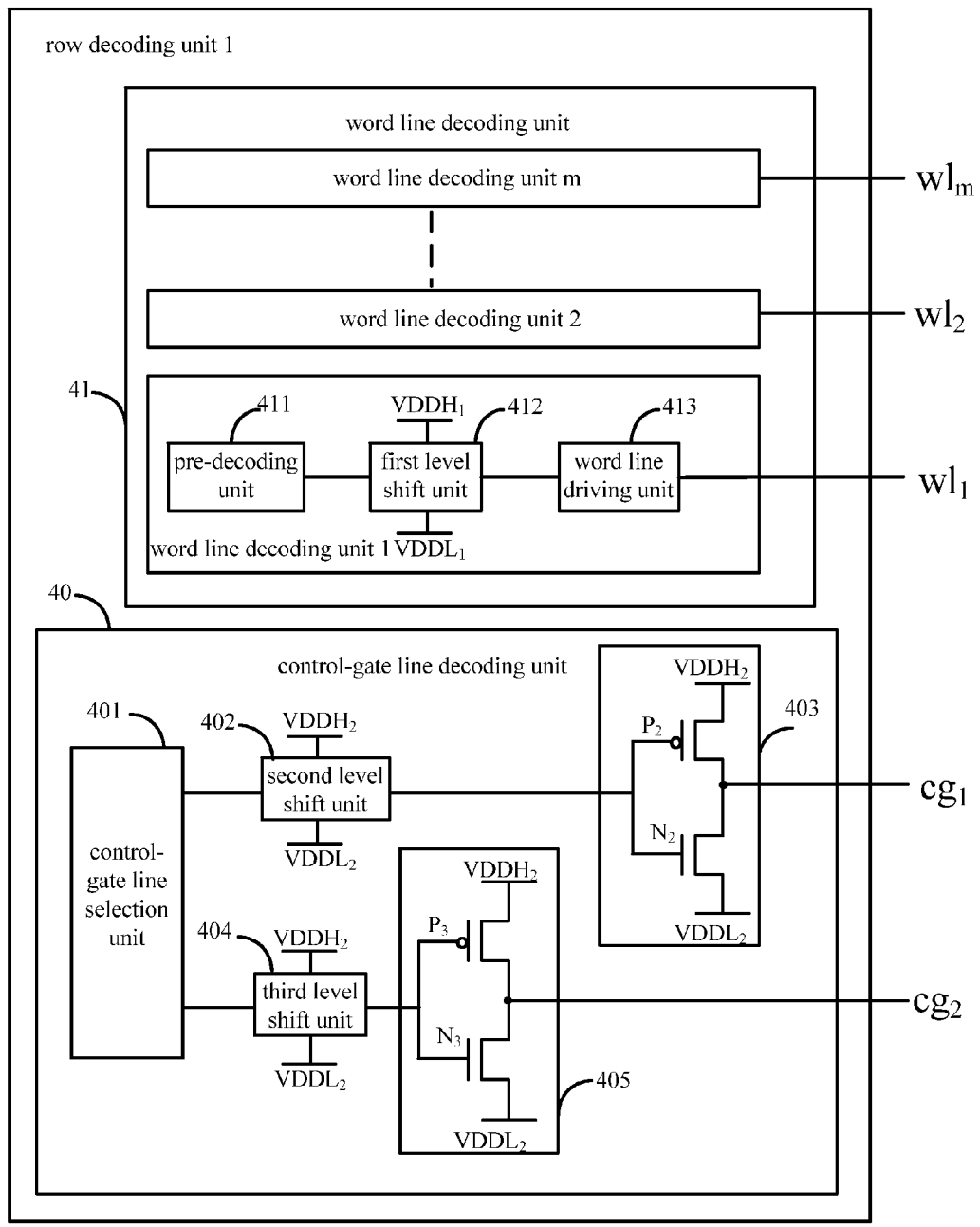
FIG. 4 illustrates a circuit schematic diagram of a row decoding unit 1 shown in FIG. 3 according to one embodiment of the present disclosure.

FIG. 4 illustrates a circuit schematic diagram of the row decoding unit 1 shown in FIG. 1. Referring to FIG. 4, the row decoding unit 1 includes a word line decoding unit 41 and a control-gate line decoding unit 40. The word line decoding unit 41 includes m word line decoding units with a same structure (a word line decoding unit 1, a word line decoding unit 2, . . . , a word line decoding unit m). The word line decoding unit 1 includes: a pre-decoding unit 411 adapted for receiving an address signal, forming a selection signal based on the address signal, and providing the selecting signal to a first level shift 412, where the selection signal is used to select a word line of a memory unit which needs to be operated; the first level shift unit 412 adapted for outputting a first driving voltage $VDDH_1$ and a second driving voltage $VDDL_1$ based on the selection signal; a word line driving unit 413 adapted for receiving the first first voltage $VDDH_1$ or the second driving voltage $VDDL_1$ output by the first level shift 412, and outputting a word line operation voltage to a word line $WL_1$ from a word line voltage output $wl_1$. The control-gate line decoding unit 40 includes: a control-gate line selection unit 401 adapted for receiving a control-gate line selection signal, selecting one of the control-gate lines connected to two memory bits of a same memory unit based on the control-gate line selection signal, and outputting a first control signal and a second control signal to a second level shift 402 and a third level shift unit 404, respectively; the second level shift unit 402 adapted for receiving the first control signal, and outputting a third driving voltage $VDDH_2$ or a fourth driving voltage $VDDL_2$ based on the first control signal; a first control-gate line driving unit 403 including a PMOS transistor $P_2$ and a NMOS transistor $N_2$, adapted for receiving the third driving voltage $VDDH_2$ or the fourth driving voltage $VDDL_2$ output by the second level shift unit 402, and outputting a first control-gate line operation voltage to a first control-gate line $CG_1$ from a first control-gate line voltage output $cg_1$; the third level shift unit 404 adapted for receiving the second control signal, and outputting a third driving voltage $VDDH_2$ or a fourth driving voltage $VDDL_2$ based on the second control signal; and a second control-gate line driving unit 405 including a PMOS transistor $P_3$ and a NMOS transistor $N_3$, adapted for receiving the third driving voltage $VDDH_2$ or the fourth driving voltage $VDDL_2$ output by the third level shift unit 404, and outputting a second control-gate line operation voltage to the second control-gate line $CG_2$ from a second control-gate line voltage output $cg_2$.

Referring to FIG. 3, each of the plurality of row decoding units 33 has a same structure as the row decoding unit 1. The row decoding unit n is taken as an example in the following description. The row decoding unit n corresponds to the memory block n of the dual-bit split gate flash memory array 34, and includes a first control-gate line voltage output $cg_p$, a second control-gate line voltage output $cg_{p+1}$ and (I-J+1) word line voltage outputs (wl<J:I>). The first control-gate line voltage output $cg_p$ is connected to (I-J+1) control-gate lines which are connected to the first memory bits of the memory units of the memory block n, respectively. $CG_p$ is used to represent the (I-J+1) control-gate lines which are connected to the first memory bits of the memory units of the memory block n respectively. The second control-gate line voltage output $cg_{p+1}$ is connected to (I-J+1) control-gate lines which are connected to the second memory bits of the memory units of the memory block n, respectively. $CG_{p+1}$ is used to represent the (I-J+1) control-gate lines which are connected to the second memory bits of the memory bits of the memory block n, respectively. The (I-J+1) word line voltage outputs (wl<j:I>) are connected to the (I-J+1) word lines (WL<J:I>) respectively, where the (I-J+1) word lines (WL<J:I>) are connected to the rows of the memory units of the memory block n, respectively.

Similar to the row decoding unit 1, the dummy row decoding unit 31 corresponds to the dummy memory array 32 of the dual-bit split gate flash memory array 34, and provides a word line operation voltage and a control-gate line operation voltage to the dummy memory array 32. Referring to FIG. 3, the dummy row decoding unit 31 includes a first dummy control-gate line voltage output $cg_1$-d, a second dummy control-gate line voltage output $cg_2$-d and (S-R+1) dummy word line voltage outputs (wl<R:S>). The first dummy control-gate line voltage output $cg_1$-d is connected to (S-R+1) control-gate lines which are connected to the first memory bits of the memory units of the dummy memory array 32, respectively. $CG_1$-d is used to represent the (S-R+1) control-gate lines which are connected to the first memory bits of the memory units of the dummy memory array 32. The second dummy control-gate line voltage output $cg_2$-d is connected to (S-R+1) control-gate lines which are connected to the second memory bits of the memory units of the dummy memory array 32. $CG_2$-d is used to represent the (S-R+1) control gate lines which are connected to the second memory bits of each of the memory units of the dummy memory array 32. The (S-R+1) word line voltage outputs (wl<R:S>) are connected to the (S-R+1) word lines (WL<R:S>) which are connected to rows of memory units of the dummy memory array 32, respectively. The dummy row decoding unit 31 includes a dummy control-gate line decoding unit and (S-R+1) dummy word line decoding units with a same structure. Referring to the circuit schematic diagram of the row decoding unit 1 shown in FIG. 4, the structure of the dummy row decoding unit 31 is similar to the structure of the row decoding unit 1.

Figure 5:
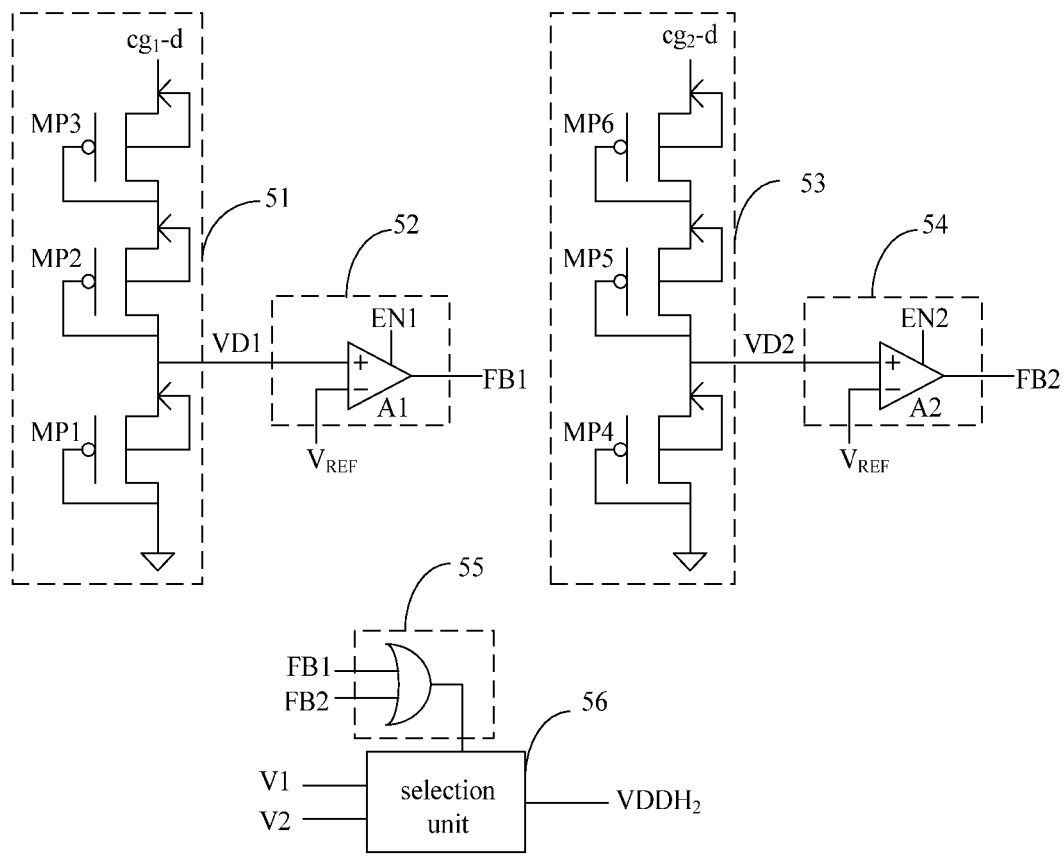
FIG. 5 illustrates a schematic structure diagram of a driving voltage generating circuit of a row decoding circuit according to one embodiment of the present disclosure.

The row decoding circuit in one embodiment of the present disclosure further includes a driving voltage generating circuit shown in FIG. 5. The driving voltage generating circuit is adapted to provide a third driving voltage to the first control-gate line voltage output and the second control-gate line voltage output of each row decoding unit. Taking the row decoding unit 1 as an example, the driving voltage generating circuit provides the third driving voltage $VDDH_2$ shown in FIG. 4. In the prior art, the third driving voltage $VDDH_2$ is a fixed value required in reading/writing a memory unit, which may result in driving the memory array at a low speed. In one embodiment of the present disclosure, after a signal indicating a reading/writing operation on a memory unit is generated, a first voltage will be output as the third driving voltage $VDDH_2$. The first voltage is higher than the voltage required in reading/writing a memory unit. When voltage of the first dummy control-gate line voltage output $cg_1$-d or the second dummy control-gate line voltage output $cg_2$-d is detected to be greater than a predetermined voltage, a second voltage will be output as the third driving voltage $VDDH_2$. The second voltage equals the voltage required in reading/writing a memory unit. The predetermined voltage is not greater than the second voltage. In one embodiment, the predetermined voltage is set equal to the second voltage.

Referring to FIG. 5, the driving voltage generating circuit includes a first voltage division unit 51, a second voltage division unit 53, a first comparison unit 52, a second comparison unit 54, a control unit 55 and a selection unit 56.

Referring to FIG. 5, the first voltage division unit 51 is adapted to divide a voltage output by the first dummy control-gate line voltage output $cg_1$-d, in order to obtain a first divided voltage VD1. The second voltage division unit 53 is adapted to divide a voltage output by the second dummy control-gate line voltage output $cg_2$-d, in order to obtain a second divided voltage VD2. The first voltage division unit 51 and the second voltage division unit 53 have a same structure. In one embodiment, the first voltage division unit 51 includes three PMOS transistors (MP1, MP2 and MP3) which are connected in series through their respective source to drain terminals, where gate and drain terminals of each PMOS transistor are connected, and substrate and source terminals are connected. The second voltage division unit 53 also includes three PMOS transistors, MP4, MP5 and MP6. It should be noted that, transistors are employed as voltage division components in the first voltage division unit 51 and the second voltage division unit 53 of the embodiment. In some embodiments, other components (e.g., resistance, capacitance, etc.) also can be employed to divide voltage. In some embodiments, the first voltage division unit 51 and the second voltage division unit 52 may have different structures.

The first comparison unit 52 is adapted to compare the first divided voltage VD1 and a reference voltage $V_{REF}$, and to output a first comparison result FB1. The second comparison unit 54 is adapted to compare the second divided voltage VD2 and the reference voltage $V_{REF}$, and to output a second comparison result FB2. In one embodiment, the first comparison unit 52 includes a first comparator A1. A positive terminal of the first comparator A1 inputs the first divided voltage VD1, a negative terminal inputs the reference voltage $V_{REF}$, an enable terminal inputs a first enable signal EN1, and an output terminal outputs the first comparison result FB1. The second comparison unit 54 includes a second comparator A2. A positive terminal of the second comparator A2 inputs the second divided voltage VD2, a negative terminal inputs the reference voltage $V_{REF}$, an enable terminal inputs a second enable signal EN2, and an output terminal outputs the second comparison result FB2. The reference voltage $V_{REF}$ may be provided by a bandgap reference source and have a value determined according to the predetermined voltage. In one embodiment, since the predetermined voltage and the second voltage are equal, the reference voltage is ⅓ times of the second voltage. The first enable signal EN1 and the second enable signal EN2 are controlled by a memory reading/writing signal. When a reading/writing operation is performed on a memory unit, the first enable signal EN1 and the second enable signal EN2 are valid. Taking the first comparator A1 as an example, when a reading/writing operation is performed on a memory unit, the first enable signal EN1 is a valid signal. If the first divided voltage VD1 input from the positive terminal of the first comparator A1 is less than the reference voltage $V_{REF}$ input from the negative terminal, the first comparison result FB1 output by the first comparator A1 is at a low level, which is defined as logic "0"; otherwise, the first comparison result FB1 is at a high level, which is defined as logic "1". The working principle of the second comparator A2 is the same as the first comparator A1, and is not described in detail herein.

The control unit 55 is adapted to output a control signal based on the first comparison result FB1 and the second comparison result FB2. In one embodiment, the control unit 55 is an OR gate. When any one of the first comparison result FB1 and the second comparison result FB2 input to the control unit 55 is at a high level, the control signal output from the control unit 55 is at a high level.

The selection unit 56 is adapted to select the first voltage V1 or the second voltage V2 as the third driving voltage $VDDH_2$ to output. In the embodiment, the selection unit 56 is a voltage selector. In particular, when the selection signal is at a low level, the selection unit 56 selects the first voltage V1 as the third driving voltage $VDDH_2$ to output; when the selection signal is at a high level, the selection unit 56 selects the second voltage V2 as the third driving voltage $VDDH_2$ to output. Both the first voltage V1 and the second voltage V2 may be provided by a charge pump circuit.

Figure 6:
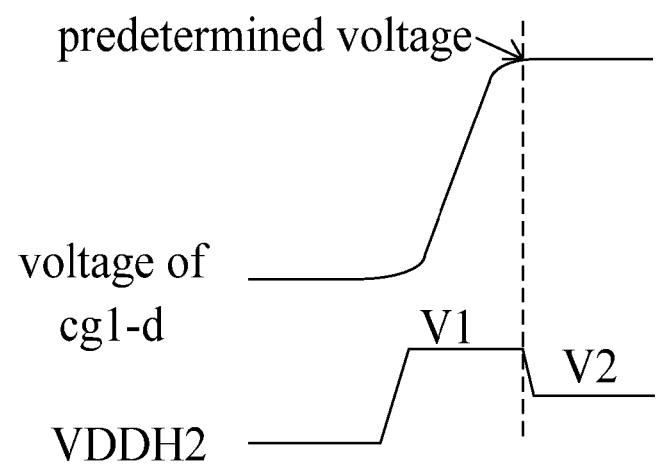
FIG. 6 illustrates a relationship diagram of a voltage output from a first dummy control-gate line voltage output and a third driving voltage according to one embodiment of the present disclosure.

FIG. 6 illustrates a relationship diagram of a voltage output from the first dummy control-gate line voltage output $cg_1$-d and the third driving voltage $VDDH_2$ according to one embodiment of the present disclosure. In order to be better understood, working principle of the row decoding circuit provided in embodiments of the present disclosure will be described in detail in conjunction with the accompanying drawings.

Referring to FIG. 3, when a reading/writing operation is performed on any memory block of the dual-bit split gate flash memory array 34, the dummy row decoding unit 31 provides a dummy word line operation voltage and a dummy control-gate line operation voltage to the dummy memory array 32. A voltage level of the first dummy control-gate line voltage output $cg_1$-d of the dummy row decoding unit 31 is the same as a voltage level of the first control-gate line voltage output $cg_1$ of each row decoding unit. A voltage level of the second dummy control-gate line voltage output $cg_2$-d is the same as a voltage level of the second control-gate line voltage output $cg_2$. Referring to FIG. 5 and FIG. 6, after a signal indicating a reading/writing operation on a memory unit is generated, the first voltage V1 will be output as the third driving voltage $VDDH_2$ and the voltage level of the first dummy control-gate line voltage output $cg_1$-d will rise gradually. After the voltage of the first dummy control-gate line voltage output $cg_1$-d rising to a predetermined voltage, a first voltage VD1 output by the first voltage division unit 51 will be greater than the reference voltage $V_{REF}$, a first comparison result FB1 output by the comparison unit 52 will be at a high level, and the control unit 55 will output a high level control signal according to the first comparison result FB1. Under control of the control signal, the selection unit 56 will select the second voltage V2 to be output as the third driving voltage $VDDH_2$.

A memory is provided in one embodiment of the present disclosure. The memory includes a dual-bit split gate flash memory array and the row decoding circuit provided in the above-described embodiments.

In summary, in the row decoding circuit provided in the embodiments of the present disclosure, a dummy memory array and a dummy row decoding unit are added. By detecting the voltage of the first dummy control-gate line voltage output and the voltage of the second dummy control-gate line voltage output of the dummy row decoding unit, the third driving voltage, which is used to drive the first control-gate line voltage output and the second control-gate line voltage output of the row decoding unit, is controlled. Thus, in an initial stage, the first voltage having a higher voltage level is output as the third driving voltage, whereby the driving speed of the memory array is increased. Due to the enhancement of the third driving voltage, the circuit area of the memory is reduced as the area of the transistor in the control-gate line driving unit of the row decoding unit is reduced. On the other hand, a memory block including a plurality of rows of memory units corresponds to a row decoding unit. The first control-gate line voltage output of a row decoding unit provides an operation voltage to control-gate lines of first memory bits of the memory units in a corresponding memory block. The second control-gate line voltage output of the row decoding unit provides an operation voltage to control-gate lines of second memory bits of the memory units in the corresponding memory block. That is, control-gate lines of different rows of memory units in a memory block share a same drive voltage, whereby the circuit area is further reduced.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A row decoding circuit adapted for providing a word line operation voltage and a control-gate line operation voltage to a dual-bit split gate flash memory array, comprising:
a dummy row decoding unit, at least one row decoding unit and a driving voltage generating circuit,
wherein the dummy row decoding unit comprises a first dummy control-gate line voltage output, a second dummy control-gate line voltage output and at least one dummy word line voltage output, the first dummy control-gate line voltage output is connected to a control gate line which is connected to a first memory bit of each memory unit of a dummy memory array, the second dummy control-gate line voltage output is connected to a control gate line which is connected to a second memory bit of each memory unit of the dummy memory array, the at least one dummy word line voltage output is connected to a word line which is connected to each row of memory units of the dummy memory array, wherein the dummy memory array comprises at least one row of memory units of the dual-bit split gate flash memory array;
wherein the row decoding unit comprises a first control-gate line voltage output, a second control-gate line voltage output and at least one word line voltage output, the first control-gate line voltage output is connect to a control-gate line which is connected to a first memory bit of each memory unit of a corresponding memory block, the second control-gate line voltage output is connected to a control-gate line which is connected to a second memory bit of each memory unit of the corresponding memory block, the at least one word line voltage output is connected to each row of memory units of the corresponding memory block, wherein the memory block comprises at least one row of memory units of the dual-bit split gate flash memory array;

wherein the driving voltage generating circuit is adapted for providing a third driving voltage to the first control-gate line voltage output and the second control-gate line voltage output, the driving voltage generating circuit comprises a first voltage division unit, a second voltage division unit, a first comparison unit, and a second comparison unit, a control unit and a selection unit;

wherein the first voltage division unit is adapted for dividing a voltage of the first dummy control-gate line voltage output to obtain a first divided voltage, the second voltage division unit is adapted for dividing a voltage of the second dummy control-gate line voltage output to obtain a second divided voltage;

wherein the first comparison unit is adapted for comparing the first divided voltage and a reference voltage, and outputting a first comparison result, the second comparison unit is adapted for comparing the second divided voltage and the reference voltage, and outputting a second comparison result;

wherein the control unit is adapted for outputting a control signal based on the first comparison result and the second comparison result which are input to the control unit, and the selection unit is adapted for selecting a first voltage or a second voltage as the third driving voltage under control of the control signal, wherein the first voltage is higher than the second voltage and the second voltage is higher than the reference voltage.

2. The row decoding circuit according to claim 1, wherein the row decoding unit further comprises a control-gate line decoding unit and at least one word line decoding unit.

3. The row decoding circuit according to claim 1, wherein the first voltage division unit comprises a plurality of PMOS transistors which are connected in series, gate and drain terminals of each PMOS transistor are connected, and a substrate and a source terminal of each PMOS transistor are connected.

4. The row decoding circuit according to claim 1, wherein the second voltage division unit comprises a plurality of PMOS transistors which are connected in series, gate and drain terminals of each PMOS transistor are connected, and a substrate and a source terminal of each PMOS transistor are connected.

5. The row decoding circuit according to claim 1, wherein the first comparison unit comprises a first comparator, a positive terminal of the first comparator unit is adapted for inputting the first divided voltage, a negative terminal of the first comparator unit is adapted for inputting the reference voltage, and an enable terminal of the first comparator unit is adapted for inputting a first enable signal.

6. The row decoding circuit according to claim 1, wherein the second comparison unit comprises a second comparator, a positive terminal of the second comparator unit is adapted for inputting the second divided voltage, a negative terminal of the second comparator unit is adapted for inputting the reference voltage, and an enable terminal of the second comparator unit is adapted for inputting a second enable signal.

7. The row decoding circuit according to claim 1, wherein the control unit is an OR gate.

8. The row decoding circuit according to claim 1, wherein if the selection signal is at a low level, the selection unit selects the first voltage as the third driving voltage to output;

if the selection signal is at a high level, the selection unit selects the second voltage as the third driving voltage to output.

9. The row decoding circuit according to claim 1, wherein the selection unit is a voltage selector.

10. The row decoding circuit according to claim 1, wherein the first voltage is provided by a charge pump circuit.

11. The row decoding circuit according to claim 1, wherein the second voltage is provided by a charge pump circuit.

12. The row decoding circuit according to claim 1, wherein the reference voltage is ⅓ times of the second voltage.

13. A memory comprising a dual-bit split gate flash memory array and a row decoding circuit adapted for providing a word line operation voltage and a control-gate line operation voltage to the dual-bit split gate flash memory array, wherein the row decoding circuit comprises a dummy row decoding unit, at least one row decoding unit and a driving voltage generating circuit, wherein the dummy row decoding unit comprises a first dummy control-gate line voltage output, a second dummy control-gate line voltage output and at least one dummy word line voltage output, the first dummy control-gate line voltage output is connected to a control gate line which is connected to a first memory bit of each memory unit of a dummy memory array, the second dummy control-gate line voltage output is connected to a control gate line which is connected to a second memory bit of each memory unit of the dummy memory array, the at least one dummy word line voltage output is connected to a word line which is connected to each row of memory units of the dummy memory array, wherein the dummy memory array comprises at least one row of memory units of the dual-bit split gate flash memory array;

wherein the row decoding unit comprises a first control-gate line voltage output, a second control-gate line voltage output and at least one word line voltage output, the first control-gate line voltage output is connect to a control-gate line which is connected to a first memory bit of each memory unit of a corresponding memory block, the second control-gate line voltage output is connected to a control-gate line which is connected to a second memory bit of each memory unit of the corresponding memory block, the at least one word line voltage output is connected to each row of memory units of the corresponding memory block, wherein the memory block comprises at least one row of memory units of the dual-bit split gate flash memory array;

wherein the driving voltage generating circuit is adapted for providing a third driving voltage to the first control-gate line voltage output and the second control-gate line voltage output, the driving voltage generating circuit comprises a first voltage division unit, a second voltage division unit, a first comparison unit, and a second comparison unit, a control unit and a selection unit;

wherein the first voltage division unit is adapted for dividing a voltage of the first dummy control-gate line voltage output to obtain a first divided voltage, the second voltage division unit is adapted for dividing a voltage of the second dummy control-gate line voltage output to obtain a second divided voltage;

wherein the first comparison unit is adapted for comparing the first divided voltage and a reference voltage, and outputting a first comparison result, the second comparison unit is adapted for comparing the second divided voltage and the reference voltage, and outputting a second comparison result;

wherein the control unit is adapted for outputting a control signal based on the first comparison result and the second comparison result which are input to the control unit, and the selection unit is adapted for selecting a first voltage or a second voltage as the third driving voltage under control of the control signal, wherein the first voltage is higher than the second voltage and the second voltage is higher than the reference voltage.

14. The memory according to claim 13, wherein the row decoding unit further comprises a control-gate line decoding unit and at least one word line decoding unit.

15. The memory according to claim 13, wherein the first voltage division unit and the second voltage division unit both comprise a plurality of PMOS transistors which are connected in series, gate and drain terminals of each PMOS transistor are connected, and a substrate and a source terminal of each PMOS transistor are connected.

16. The memory according to claim 13, wherein the first comparison unit comprises a first comparator, a positive terminal of the first comparator unit is adapted for inputting the first divided voltage, a negative terminal of the first comparator unit is adapted for inputting the reference voltage, and an enable terminal of the first comparator unit is adapted for inputting a first enable signal.

17. The memory according to claim 13, wherein the second comparison unit comprises a second comparator, a positive terminal of the second comparator unit is adapted for inputting the second divided voltage, a negative terminal of the second comparator unit is adapted for inputting the reference voltage, and an enable terminal of the second comparator unit is adapted for inputting a second enable signal.

18. The memory according to claim 13, wherein the control unit is an OR gate, and the selection unit is a voltage selector.

19. The memory according to claim 13, wherein if the selection signal is at a low level, the selection unit selects the first voltage as the third driving voltage to output; if the selection signal is at a high level, the selection unit selects the second voltage as the third driving voltage to output.

20. The memory according to claim 13, wherein the first voltage and the second voltage are proved by a charge pump circuit, and the reference voltage is ⅓ times of the second voltage.

* * * * *